(12) United States Patent
Lu et al.

(10) Patent No.: US 11,923,393 B2
(45) Date of Patent: Mar. 5, 2024

(54) SEMICONDUCTOR IMAGE SENSOR HAVING REFLECTION COMPONENT AND METHOD OF MAKING

(71) Applicant: TAIWAN SEMICONDUCTOR MANUFACTURING COMPANY, LTD., Hsichu (TW)

(72) Inventors: Chun-Liang Lu, Hsinchu (TW); Cheng-Hao Chiu, Hsinchu (TW); Huan-En Lin, Hsinchu (TW); Chun-Hao Chou, Hsinchu (TW); Kuo-Cheng Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 177 days.

(21) Appl. No.: 17/143,874

(22) Filed: Jan. 7, 2021

(65) Prior Publication Data

US 2022/0216261 A1    Jul. 7, 2022

(51) Int. Cl.
*H01L 27/146* (2006.01)

(52) U.S. Cl.
CPC .. *H01L 27/14629* (2013.01); *H01L 27/14621* (2013.01); *H01L 27/14627* (2013.01); *H01L 27/14636* (2013.01); *H01L 27/14645* (2013.01); *H01L 27/14685* (2013.01); *H01L 27/14689* (2013.01)

(58) Field of Classification Search
CPC ...................... H01L 27/14629; H01L 31/0216
See application file for complete search history.

(56) References Cited

U.S. PATENT DOCUMENTS

| | | | | |
|---|---|---|---|---|
| 5,952,645 A | * | 9/1999 | Wang | H01L 27/14629 257/E31.128 |
| 8,455,811 B2 | * | 6/2013 | Tay | H01L 27/14629 257/432 |
| 8,735,953 B2 | * | 5/2014 | Gidon | H01L 27/1464 257/292 |
| 9,293,490 B2 | * | 3/2016 | Chien | H01L 27/1463 |
| 9,659,991 B2 | * | 5/2017 | Kumano | H04N 5/2252 |
| 10,361,231 B2 | * | 7/2019 | Kumano | H01L 27/14636 |
| 2007/0040102 A1 | * | 2/2007 | Mouli | H01L 27/14623 250/214.1 |
| 2009/0166518 A1 | * | 7/2009 | Tay | H01L 27/14629 264/1.24 |
| 2009/0250777 A1 | * | 10/2009 | Takamiya | H01L 27/14625 257/E31.127 |
| 2010/0203665 A1 | * | 8/2010 | Park | H01L 27/14645 257/E31.127 |
| 2010/0317142 A1 | * | 12/2010 | Tay | H01L 27/14687 438/69 |

(Continued)

*Primary Examiner* — Mounir S Amer
*Assistant Examiner* — Alexander Belousov
(74) *Attorney, Agent, or Firm* — Hauptman Ham, LLP (57) ABSTRACT

A semiconductor image sensor includes a pixel. The pixel includes a first substrate; and a photodiode in the first substrate. The semiconductor image sensor further includes an interconnect structure electrically connected to the pixel. The semiconductor image sensor further includes a reflection structure between the interconnect and the photodiode, wherein the reflection structure is configured to reflect light passing through the photodiode back toward the photodiode.

19 Claims, 8 Drawing Sheets

(56) References Cited

U.S. PATENT DOCUMENTS

| | | | |
|---|---|---|---|
| 2011/0031381 A1* | 2/2011 | Tay | H01L 27/14629 |
| | | | 250/226 |
| 2014/0111664 A1* | 4/2014 | Kumano | H01L 27/1462 |
| | | | 348/222.1 |
| 2017/0170230 A1* | 6/2017 | Kumano | H01L 27/1462 |
| 2019/0035826 A1* | 1/2019 | Kawahara | H01L 31/0216 |
| 2022/0165776 A1* | 5/2022 | Lin | H01L 27/14629 |
| 2022/0216261 A1* | 7/2022 | Lu | H01L 27/14627 |

* cited by examiner

SEMICONDUCTOR IMAGE SENSOR HAVING REFLECTION COMPONENT AND METHOD OF MAKING

BACKGROUND

Semiconductor image sensors are usable to detect light. Semiconductor image sensors include complementary metal-oxide-semiconductor (CMOS) image sensors (CIS) as well as charge-coupled device (CCD) sensors. Semiconductor image sensors are used in devices such as digital cameras and mobile phones. Semiconductor image sensors include front side illuminated sensors (FSI) as well as back side illuminated sensors (BSI). An FSI receives light through an interconnect structure, while a BSI receives light from an opposite side of the substrate from the interconnect structure.

The image sensors include an array of pixels. The array of pixels is divided into pixel groups with individual pixels within each group. Each of the pixels within a pixel group is designed to detect a certain spectrum of light, e.g., red, blue, green or white. Photons from incident light contact light sensing components of the pixel. The light sensing components then generate electrons based on the amount of photons detected. A conversion rate from received photons and generated electrons is measured as quantum efficiency (QE). As the number of electrons generated per amount of photons increases, the QE increases. As QE increases, image quality of the semiconductor image sensor also increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor image sensors have a wide variety of applications including digital cameras in mobile phones. As integrated circuits continue to shrink, pixels within the semiconductor image sensor also decrease in size and are more densely spaced within the semiconductor image sensor. This reduction in size and increased density reduces an amount of light incident on light sensing elements of each pixel. Increasing a rate of detecting photons from the incident light, i.e., quantum efficiency (QE), of the pixel helps to offset the reduction in the amount of light incident on the pixel while still maintaining high image quality.

Reflecting light that passes through the light sensing element back toward the light sensing element helps to improve QE. When light passes from one material to another material, the light is redirected. An amount of redirection of the light is based on a difference between the refractive indices of the two materials. A small refractive index difference will result in a mere bending of the light. However, as the refractive index increases, reflection occurs and the light is returned back toward the incident direction.

According to some embodiments of this disclosure, the semiconductor image sensor includes a reflection component on an opposite side of a light sensing element within the pixel. The reflection component reflects light that passes through the light sensing element back toward the light sensing element in order to improve the electron generation by the light sensing element. In some embodiments, the reflection component includes a void, such as an air gap. The refractive index of air is 1, while a refractive index of silicon is approximately 3.42. This large refractive index difference results in reflection of light passing from a silicon substrate to the void. In some embodiments, the reflection component includes a different material that exhibits a large refractive index difference with the substrate. In some embodiments, the reflection component includes layers of materials configured to reflect incident light. For example, in some embodiments, the reflection component includes alternating layers of silicon nitride having different N/Si ratios. As the amount of nitrogen in the silicon nitride increases, the refractive index of the material decreases. By alternating layers of silicon nitride that have different amounts of nitrogen, incident light is reflected back toward the light sensing element of the pixel.

In some embodiments, the reflection component is used selectively in some pixels and not in other pixels. The human eye detects green light at a higher rate than other wavelengths of light. By using the reflection component in pixels for detecting green light, image quality detectable by the human eye is increased. In some embodiments, the reflection component is used in all pixels near an edge of a wafer or an edge of the semiconductor image sensor in order to help account for increased manufacturing variation that occurs near edges of wafers. Using the reflection component increases the QE of the semiconductor image sensor, which produces higher quality images.

Figure 1:
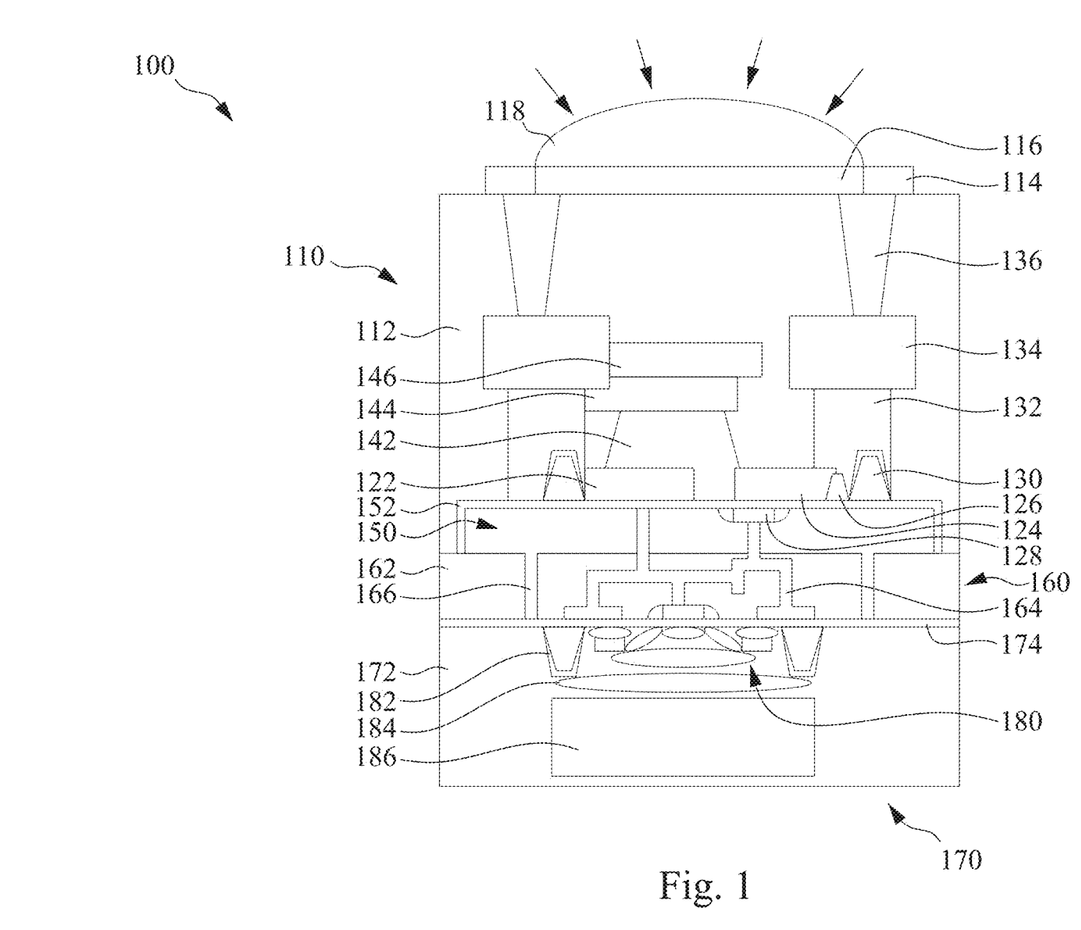
FIG. 1 is a cross-sectional view of a semiconductor image sensor in accordance with some embodiments.

FIG. 1 is a cross-sectional view of a semiconductor image sensor 100 in accordance with some embodiments. The semiconductor image sensor 100 is a three-dimensional (3D) CIS (3D-CIS). The semiconductor image sensor 100 includes a pixel 110 and a second component 170 including a transistor 180 electrically connected to the pixel 110 by an interconnect 160. The pixel 110 is configured to receive incident light, convert the incident light into electrons and then transfer the electrons to the transistor 180 through the interconnect 160. The transistor 180 is part of a logic circuit configured to generate an image using the electrons from the pixel 110.

The pixel 110 includes a substrate 112. A blocking layer 114 is over a portion of the substrate 112. A filter 116 is over the substrate 112 and is surrounded by the blocking layer 114. A lens 118 is over the filter 116 and is configured to direct incident light into the pixel 110. A partially pinned photodiode (PPPD) 122 acts as a light sensing element for the pixel 110. An n-type lightly doped (NLD) region 124 is selectively electrically connected to the PPPD 122. A highly doped n-type region 126 contacts the NLD region 124 on an opposite side from the PPPD 122. A transfer gate 128 is configured to selectively connect the PPPD 122 and the NLD 124. A shallow trench isolation (STI) 130 surrounds the PPPD 122, the NLD 124 and the highly doped n-type region 126 and the STI 130 is configured to electrically isolate the pixel 110 from adjacent pixels. A first p-well 132 is over the STI 130. A second p-well 134 is over the first p-well 132. A deep trench isolation (DTI) 136 is between the second p-well 134 and the blocking layer 114. The pixel 110 includes additional light sensing elements. The additional light sensing elements include a first n-type pinned photodiode (NPPD) 142 contacting the PPPD 122. A second NPPD 144 is over the first NPPD 142; and a third NPPD 146 is over the second NPPD 144. In some embodiments, there are fewer additional light sensing elements or the additional light sensing elements are omitted.

A void 150 is below the PPPD 122 and is configured to reflect light that passes through the PPPD 122 back toward the PPPD 122. In some embodiments, the transfer gate 128 extends into the void 150. An oxide layer 152 is between the void 150 and elements of the pixel 110 within the substrate 112. The oxide layer 152 helps to protect the substrate 112 and the other components of the pixel 110 during removal of a sacrificial material to form the void 150.

The interconnect 160 is below the void 150. The interconnect 160 includes layers of dielectric material 162 surrounding conductive elements 164 in order to provide electrical connections between the pixel 110 and the transistor 180 as well as other components (not shown) in the semiconductor image sensor 100. The interconnect 160 further includes a plurality of openings 166 extending from a surface of the interconnect 160 closest to the pixel 110 through the interconnect structure 160. The openings 166 permit etchants to reach a sacrificial material (not shown) that is removed to define the void 150. In some embodiments, the openings 166 do not extend through an entirety of the interconnect 160. The conductive elements 164 extend through the void 150 to electrically connect to the PPPD 122 and the transfer gate 128.

The transistor 180 is used as an example component to be electrically connected to the pixel 110 by the interconnect 160. Because the transistor 180 is located on an opposite side of the interconnect 160 from the pixel 110, the semiconductor image sensor 100 is called a three-dimensional (3D) integrated circuit (3DIC). The transistor 180 is in a substrate 172. The transistor 180 includes a gate structure, a channel and source/drain (S/D) regions, which are not labeled for the sake of clarity in the drawing. STI 182 surrounds channel and S/D regions of the transistor 180. A p-well 184 is below the STI 182 and a deep n-well (DNW) 186 is below the p-well 184. Conductive elements 164 of the interconnect structure 160 electrically connect to the gate and S/D regions of the transistor 180.

In some embodiments, substrate 112 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 112 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

The blocking layer 114 helps to prevent cross-talk between adjacent pixels of the semiconductor image sensor 100 by blocking incident light. In some embodiments, the blocking layer 114 includes carbon black. In some embodiments, the blocking layer includes a light absorbing material.

The filter 116 filters incident light so that only a selected waveband of the incident light is incident on the PPPD 122. The filter 116 is called a color filter in some embodiments. In some embodiments, the semiconductor image sensor 100 includes a repeating array of pixels, e.g., the pixel 110, within the overall image sensor device. Each of the pixels is configured to receive a certain waveband of light corresponding to a color visible to the human eye. In some embodiments, the filter 116 is configured to pass green light. In some embodiments, the filter 116 is configured to pass red light or blue light. In some embodiments, the filter 116 is configured to pass another waveband of light. In some embodiments, the filter 116 is a cut filter. In some embodiments, the filter 116 is a reflection filter. In some embodiments, the filter 116 is an absorption filter.

The lens 118 is configured to bend incident light to be directed toward the PPPD 122 in order to maximize the amount of light that reaches the PPPD 122. In some embodiments, each pixel 110 includes a separate and distinct lens 118. In some embodiments, the lens 118 is part of a continuous array of lenses across the semiconductor image sensor 100.

The PPPD 122 is configured to receive the incident light and convert photons of the incident light into an electrical signal. A rate of conversion of the photons to the electrical signal is the QE of the PPPD 122. A higher QE for the PPPD 122 will result in a more accurate, i.e., higher quality, image. The PPPD 122 is in direct contact with the oxide layer 152. A surface of the PPPD 122 closest to the interconnect 160 is substantially co-planar with a surface of the NLD region 124 closest to the interconnect 160. In some embodiments, the PPPD 122 includes p-type dopants. In some embodiments, a sidewall of the PPPD 122 directly contacts a portion of the STI 130. The PPPD 122 is spaced from an edge of the transfer gate 128 in a direction parallel to a top surface of the substrate 112. In some embodiments, the PPPD 122 extends under a portion of the transfer gate 128. In some embodiments, the PPPD 122 is formed using an ion implantation process. In some embodiments, the PPPD 122 is formed by depositing a layer of dopant material and driving the dopants into the substrate 112 using an annealing process.

The NLD region 124 extends to an opposite side of the transfer gate 128 from the PPPD 122. The NLD region 124 is configured to be selectively electrically connected to the PPPD 122 by activation of the transfer gate 128. The NLD region 124 is in direct contact with the highly doped n-type region 126. A dopant concentration in the NLD region 124 is less than a dopant concentration in the highly doped n-type region 126. In some embodiments, a species of dopant in the NLD region 124 is a same species as a species in the highly doped n-type region 126. In some embodiments, the species of dopant in the NLD region 124 is different from the species in the highly doped n-type region 126. The NLD region 124 directly contacts the oxide layer 152. The NLD region 124 extends under the transfer gate 128. The NLD region 124 directly contacts the NPPD 142. In some embodiments, the NLD region 124 is separated from the NPPD 142. In some embodiments, the NLD region 124 is formed using an ion implantation process. In some embodiments, the NLD region 124 is formed by depositing a layer of dopant material and driving the dopants into the substrate 112 using an annealing process.

The highly doped n-type region 126 acts as a source/drain (S/D) region for selectively receiving the electrical signal from the PPPD 122 based on activation of the transfer gate 128. In some embodiments, the highly doped n-type region 126 directly contacts the STI 130. In some embodiments, the highly doped n-type region 126 is separated from the STI 130. The highly doped n-type region 126 directly contacts the oxide layer 152. A surface of the highly doped n-type region 126 closest to the interconnect 160 is co-planar with the surface of the PPPD 122 closest to the interconnect 160. In some embodiments, the highly doped n-type region 126 is configured to covey the electrical signal collected by the PPPD 122 to external components, e.g., the transistor 180. In some embodiments, the highly doped n-type region 126 is formed using an ion implantation process. In some embodiments, the highly doped n-type region 126 is formed by depositing a layer of dopant material and driving the dopants into the substrate 112 using an annealing process.

The transfer gate 128 is configured to selectively connect the PPPD 122 to the NLD region 124 and the highly doped n-type region 126. In some embodiments, the transfer gate 128 includes is a planar type gate structure. In some embodiments, the transfer gate 128 is part of a fin field effect transistor (FinFET) type gate structure. In some embodiments, the transfer gate 128 is part of a gate all around (GAA) type gate structure. The transfer gate 128 extends into the void 150 beyond the oxide layer 152. The transfer gate 128 includes a conductive material, such as polysilicon or metal, configured to receive a signal for selectively activating the transfer gate 128 to electrically connect the PPPD 122 and the highly doped n-type region 126. In some embodiments, the transfer gate 128 includes a gate dielectric layer between the conductive material and the substrate 112. In some embodiments, the gate dielectric layer includes a high-k dielectric layer. In some embodiments, the transfer gate 128 further includes an interfacial layer between the gate dielectric and the substrate 112. In some embodiments, the transfer gate 128 includes spacers adjacent the conductive material. The transfer gate 128 overlaps the NLD region 124. In some embodiments, the oxide layer 152 is between the transfer gate 128 and the NLD region 124. In some embodiments, the oxide layer 152 is usable as the gate dielectric layer. The transfer gate 128 overlaps the NPPD 142. In some embodiments, the transfer gate 128 overlaps the PPPD 122. In some embodiments, the transfer gate 128 is formed using a series of deposition and etching processes. In some embodiments, the transfer gate 128 is formed using a replacement gate process.

The STI 130 is configured to electrically isolate the pixel 110 from adjacent pixels or other components of the semiconductor image sensor 100. In some embodiments, the STI 130 includes silicon oxide. In some embodiments, the STI 130 includes another dielectric material different from silicon oxide. In some embodiments, the STI 130 is formed by etching a trench in the substrate 112 and filling the trench with a dielectric material. In some embodiments, the STI 130 is formed using a local oxidation (LOCOS) process. In some embodiments, a surface of the STI 130 closest to the interconnect 160 is co-planar with the surface of the PPPD 122 closest to the interconnect 160. A depth of the STI 130 in the substrate 112 is greater than a depth of the PPPD 122 in the substrate 112.

The first p-well 132 and the second p-well 134 are used to reduce noise and cross-talk between the pixel 110 and adjacent pixels in the semiconductor image sensor 100. The first p-well 132 is adjacent to the STI 130. In some embodiments, a surface of the first p-well 132 closest to the interconnect 160 is co-planar with the surface of the PPPD 122 closest to the interconnect 160. In some embodiments, the first p-well 132 directly contacts the PPPD 122 and/or the highly doped n-type region 126. In some embodiments, the first p-well 132 is formed using an ion implantation process.

The second p-well 134 is between the first p-well 132 and the DTI 136. In some embodiments, a dimension of the second p-well 134 in a first direction parallel to a top surface of the substrate 112 is greater than a dimension of the first p-well 132 in the first direction. In some embodiments, a species of dopant in the first p-well 132 is a same species of dopant as in the second p-well 134. In some embodiments, the species of dopant in the first p-well 132 is different from the species of dopant in the second p-well 134. In some embodiments, a dopant concentration of the first p-well 132 is equal to a dopant concentration of the second p-well 134. In some embodiments, the dopant concentration of the first p-well 132 is different from the dopant concentration of the second p-well 134. In some embodiments, the second p-well 134 is formed using an ion implantation process. In some embodiments, the second p-well 134 is formed prior to forming the first p-well 132. In some embodiments, the second p-well 134 is formed after forming the first p-well 132.

The DTI 136 helps to provide electrical and optical isolation between adjacent pixels of the semiconductor image sensor 100. The DTI 136 extends from the light incident surface of the substrate 112 to the second p-well 134. In some embodiments, the DTI 136 includes silicon oxide. In some embodiments, the DTI 136 includes a different dielectric material. In some embodiments, the DTI 136 is formed by etching a trench into the substrate 112 and filling the trench with a dielectric materials.

The first NPPD 142, the second NPPD 144 and the third NPPD 146, collectively called NPPDs 142-146, all act to help to convert photons into electrical signal. The NPPDs 142-146 help to improve the overall QE for the semiconductor image sensor 100 in comparison with sensors that only include a PPPD, e.g., PPPD 122. In some embodiments, all of the NPPDs 142-146 include a same dopant species. In some embodiments, at least one of the NPPDs 142-146 includes a different dopant species from another of the NPPDs 142-146. In some embodiments, each of the NPPDs 142-146 are formed by ion implantation. In some embodiments, a dopant concentration in each of the NPPDs 142-146 is substantially equal. In some embodiments, the dopant concentration in one of the NPPDs 142-146 is different from the dopant concentration in another of the NPPDs 142-146.

The NPPD 142 directly contacts the PPPD 122. The NPPD 142 extends under the transfer gate 128. A surface of the NPPD 142 closest to the interconnect 160 is co-planar with the surface of the PPPD 122 closest to the interconnect 160. In some embodiments, the surface of the NPPD 142 closest to the interconnect 160 is not co-planar with the surface of the PPPD 122 closest to the interconnect 160.

The NPPD 144 is farther from the interconnect 160 than the NPPD 142. The NPPD 144 directly contacts the NPPD 142. The NPPD 144 directly contacts both the first p-well 132 and the second p-well 134. In some embodiments, the NPPD 144 is separated from at least one of the first p-well 132 or the second p-well 134.

The NPPD 146 is farther from the interconnect 160 than the NPPD 144. The NPPD 144 directly contacts the NPPD 146. The NPPD 146 directly contacts the second p-well 134. In some embodiments, the NPPD 146 is separated from the second p-well 134.

The void 150 is provided a low refractive index material adjacent to the PPPD 122 in order to increase reflection at an interface of the void 150 closes to the lens 118. The increased reflection at the interface of the void 150 helps to re-direct incident light back to the PPPD 122 in order to increase the QE of the semiconductor image sensor 100 in comparison to devices which do not include the increased reflection. In some embodiments, the void 150 is an air gap, which has a refractive index of 1. In some embodiments, the void 150 includes another gas, such as helium or nitrogen gas. By including a non-reactive gas, such as helium or nitrogen, oxidation that is possible due to exposure to air is decreased; however, manufacturing cost is increased. In some embodiments, the void 150 is filled with a low refractive index material. In some embodiments, the low refractive index material has a refractive index of less than 2.4. In some embodiments, the low refractive index material has a refractive index of less than 2. If the refractive index of the low refractive index material is too high, then reflection at the interface is reduced and the QE of the semiconductor image sensor 100 is not significantly increased in comparison with a device that does not include the void 150.

The void 150 is defined by a recess in the substrate 112. In some embodiments, each pixel 110 includes a void 150 that is discontinuous with adjacent pixels in the semiconductor image sensor 100. In some embodiments, the void 150 is continuous across multiple pixels of the semiconductor image sensor 100. In some embodiments, the void 150 is formed by etching the substrate 112 to define a recess. The recess is then filled with a sacrificial material. The interconnect 160 is then formed over the sacrificial material and the trenches 166 in the interconnect 160 are used to introduce etchants for removing the sacrificial material to define the void 150. In some embodiments, the recess is filled with a low refractive index material instead of the sacrificial material and the low refractive index material is not removed. In some embodiments that use the low refractive index material, the interconnect 160 is free of the trenches 166.

In some embodiments, a height of the void 150 in a direction perpendicular to the top surface of the substrate 112 is approximately equal to a height of the transfer gate 128. In some embodiments, the height of the void 150 ranges from about 25 nanometers (nm) to about 50 nm. If the height of the void 150 is too small, then the ability of the void 150 to increase the reflection at the interface is reduced, in some instances. If the height of the void 150 is too large, then a size of the semiconductor image sensor 100 is increased without a significant improvement in performance, in some instances.

The oxide layer 152 is used to help protect the substrate 112 and components of the pixel 110 from oxidation from the material, such as air, in the void 150. In some embodiments, the oxide layer 152 is formed by a thermal oxidation process following formation of the recess in the substrate 112 to define the void 150.

The interconnect 160 is used to electrically connect the pixel 110 to other components in the semiconductor image sensor 100, such as the transistor 180. The interconnect 160 extends beyond the void 150 in the direction parallel to the top surface of the substrate 112. The interconnect 160 includes a plurality of conductive elements 164 surrounded by dielectric material 162. The trenches 166 extend through the interconnect 160 and provide a fluid connection to the void 150. In some embodiments, where the void 150 is filled with a low refractive index material, the trenches 166 are omitted. In some embodiments, the interconnect 160 includes multiple metal levels. A metal level is a layer of conductive vias extending in the direction perpendicular to the top surface of the substrate 112 and/or conductive lines extending in the direction parallel to the top surface of the substrate 112. For example, in some embodiments, a metal level of the interconnect structure closest to the pixel 110 is called a zero metal level or M0. In some embodiments, a metal level on an opposite side of the zero metal level from the pixel 110 is called a first metal level or M1.

The dielectric material 162 is used to electrically isolate the conductive elements 164 from one another in order to reduce short circuits. In some embodiments, the dielectric material 162 includes a low-k dielectric material. In some embodiments, the dielectric material 162 includes an interlayer dielectric (ILD) and/or a plurality of intermetal dielectric (IMD) layers. In some embodiments, the dielectric material 162 includes at least one of silicon oxide, silicon nitride, silicon oxynitride or another suitable dielectric material. The dielectric material 162 has a different etch selectivity from the sacrificial material removed to define the void 150. In some embodiments, the dielectric material 162 is formed by chemical vapor deposition (CVD), atomic layer deposition (ALD) or another suitable deposition process.

The conductive elements 164 are used to convey electrical signals from the pixel 110 to other components in the semiconductor image sensor 100. In some embodiments, the conductive elements 164 include copper, aluminum, tungsten or another suitable conductive material. The conductive elements 164 extend through the void 150 to electrically connect to the pixel 110. In some embodiments, the conductive elements 164 that extend into the void have a liner material over the conductive material in order to protect the conductive material during removal of the sacrificial material. In some embodiments, all of the conductive elements 164 include the liner material. In some embodiments, only the conductive elements 164 that extend into the void 150 include the liner material. In some embodiments, the conductive elements 164 are formed using a damascene process. In some embodiments, the conductive elements 164 are formed using plating, physical vapor deposition (PVD), ALD or another suitable deposition process.

The trenches 166 extend through the interconnect 160 in order to provide a fluid connection to the void 150. In some embodiments, a width of the trenches 166 is equal to a width of a via of the conductive elements 164 in order to avoid increased production costs. In some embodiments, the trenches 166 extend through an entirety of the interconnect 160. In some embodiments, the trenches 166 extend through less than all of the interconnect 160. In some embodiments, the trenches 166 extend through two or fewer metal levels of the interconnect, e.g., M0 and M1. In some embodiments, a portion of the trenches 166 farthest from the pixel 110 is partially filled by the dielectric material 162 during formation of subsequent metal levels added after formation of the trenches 166. In some embodiments, the portion of the trenches 166 is partially filed by the oxide layer 174. In some embodiments, the trenches 166 are formed by etching the dielectric material 162. In some embodiments, the etching is a wet etching process or a dry etching process. In some embodiments, the etching is performed after the entire interconnect 160 is formed. In some embodiments, the etching is performed prior to the entire interconnect 160 being formed. The semiconductor image sensor 100 includes two trenches 166. In some embodiments, the semiconductor image sensor 100 includes more than two trenches 166. As the number of trenches increases, a duration of a removal process for removing the sacrificial material decreases, which reduces an amount of damage to the dielectric material 162 adjacent to the trenches 166. However, as the number of trenches increases, routing options for the conductive elements 164 decrease because more space in the interconnect 160 is occupied by the trenches. In some embodiments, reduced routing options results in increasing a size of the semiconductor image sensor 100. In some embodiments, the trenches 166 are lined with a liner material in order to protect the dielectric material 162 during the removal of the sacrificial material. In some embodiments, the liner material to protect the dielectric material 162 is a same material as the liner material to protect the conductive elements 164. In some embodiments, the liner material to protect the dielectric material 162 is different from the liner material to protect the conductive elements 164.

The second component 170 is bonded to the pixel 110 and is used to form devices, such as logic devices, to generate an image based on the photons detected by the pixel 110. The second component includes the substrate 172 and an oxide layer 174 over the substrate. A channel of the transistor 180 is formed in the substrate 172.

In some embodiments, substrate 172 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 172 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, the substrate 172 includes a same material as the substrate 112. In some embodiments, the substrate 172 includes a different material from the substrate 112.

The oxide layer 174 is used to help protect the substrate 172 and components of the second component 170 from oxidation during bonding to the pixel 110 and/or interconnect 160. In some embodiments, the oxide layer 174 is formed by a thermal oxidation process.

The transistor 180 is used to perform logic functions on the electrical signal generated by the pixel 110 in order to generate an image based on the detected photons. In some embodiments, the transistor 180 is a MOS transistor. In some embodiments, the transistor 180 is a FinFET transistor. In some embodiments, the transistor 180 is a GAA transistor.

The STI 182 is configured to electrically isolate the transistor 180 from adjacent transistors or other components of the semiconductor image sensor 100. In some embodiments, the STI 182 includes silicon oxide. In some embodiments, the STI 182 includes another dielectric material different from silicon oxide. In some embodiments, the STI 182 is formed by etching a trench in the substrate 172 and filling the trench with a dielectric material. In some embodiments, the STI 182 is formed using a local oxidation (LOCOS) process.

The p-well 184 is used to help reduce noise in the signals to and from the transistor 180 and to reduce current leakage. In some embodiments, the p-well 184 is omitted. In some embodiments, the p-well 184 is formed by ion implantation.

The DNW 186 is used to help reduce noise in the signals to and from the transistor 180 and to reduce current leakage. In some embodiments, the DNW 186 is omitted. In some embodiments, the DNW 186 is formed by ion implantation.

The above description of the semiconductor image sensor 100 uses specific examples of p-type doping and n-type doping for various components. One of ordinary skill in the art would recognize that reversing the dopant types would be within the skill of one of ordinary skill in the art.

Figure 2:
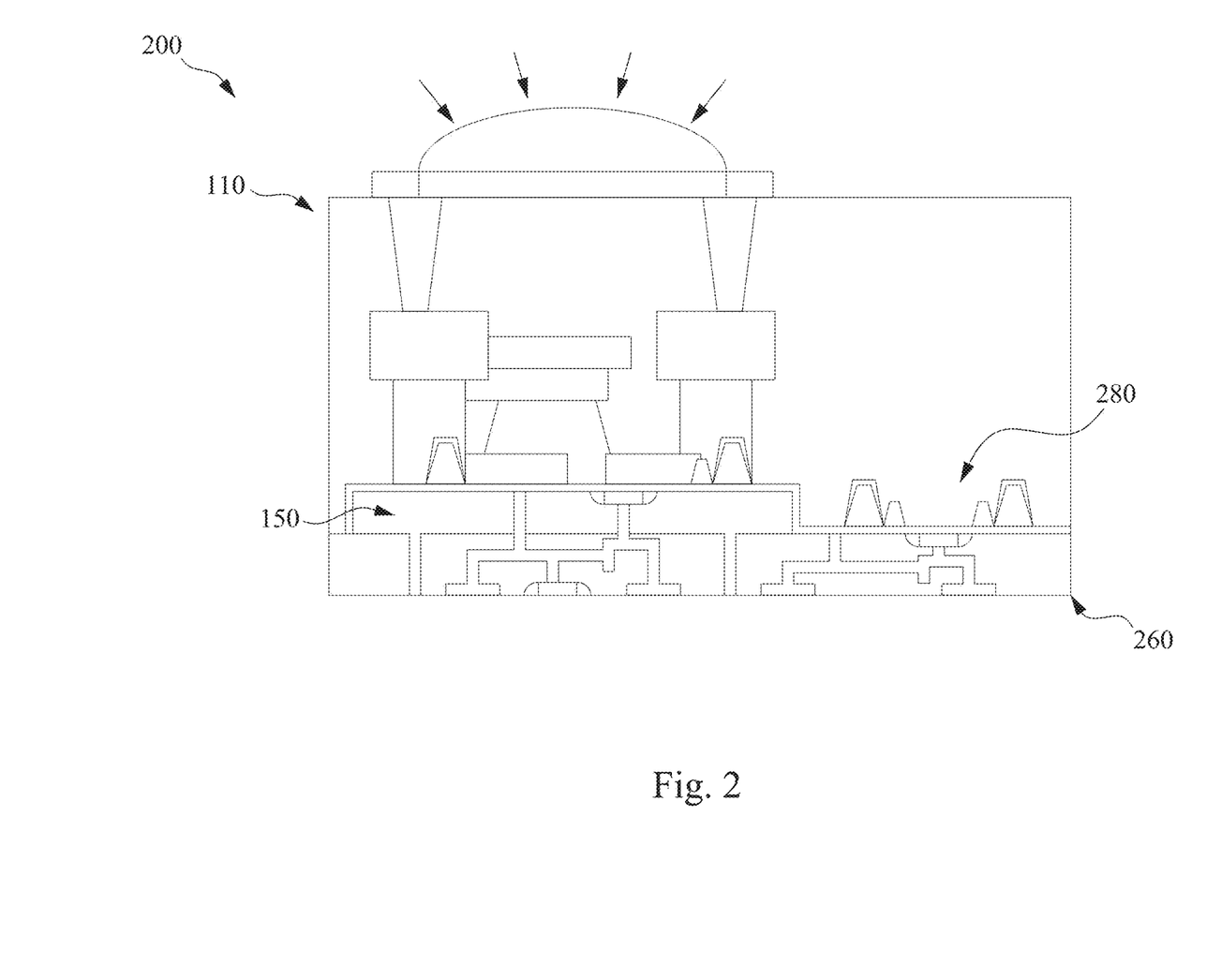
FIG. 2 is a cross-sectional view of a semiconductor image sensor in accordance with some embodiments.

FIG. 2 is a cross-sectional view of a semiconductor image sensor 200 in accordance with some embodiments. In comparison with the semiconductor image sensor 100, the semiconductor image sensor 200 is a two-dimensional (2D) integrated circuit (2DIC). That is, a transistor 280 is on a same side of an interconnect 260 as the pixel 110. The pixel 110 is similar to the pixel 110 described with respect to the semiconductor image sensor 100 (FIG. 1), and description of the pixel 110 is omitted for the sake of brevity.

The interconnect 260 is similar to the interconnect 160 in the semiconductor image sensor 100 (FIG. 1). In contrast, with the interconnect 160, the interconnect 260 electrically connects the pixel 110 to the transistor 280 on a same side of the interconnect 260.

The transistor 280 is used to perform logic functions on the electrical signal generated by the pixel 110 in order to generate an image based on the detected photons. In some embodiments, the transistor 280 is a MOS transistor. In some embodiments, the transistor 280 is a FinFET transistor. In some embodiments, the transistor 280 is a GAA transistor. A surface of the pixel 110 closest to the interconnect 260 is offset with respect to a surface of the transistor 280 closest to the interconnect 260. The offset is due to the presence of the void 150.

Figure 3A:
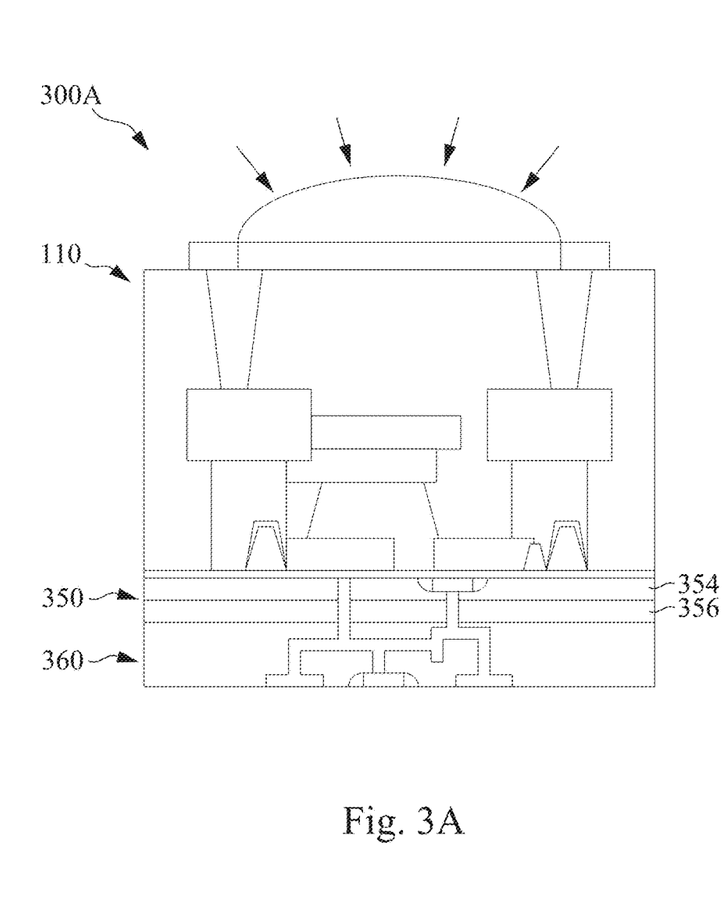
FIG. 3A is a cross-sectional view of a semiconductor image sensor in accordance with some embodiments.

FIG. 3A is a cross-sectional view of a semiconductor image sensor 300A in accordance with some embodiments. In comparison with the semiconductor image sensor 100, the semiconductor image sensor 300A includes alternating layers 350 in place of the void 150. The semiconductor image sensor 300A includes a low N silicon nitride layer 354 farther from an interconnect 360. A high N silicon nitride layer 356 is between the low N silicon nitride layer 354 and the interconnect 360. The high N silicon nitride layer 356 has a higher nitrogen concentration than the low N silicon nitride layer 354. As the nitrogen concentration in silicon nitride changes, a refractive index of the material also changes. A high nitrogen content results in a lower refractive index. For example, a refractive index for a silicon nitride having an N/Si ratio of 1.33 is less than 2.05. In comparison, a refractive index for a silicon nitride having an N/Si ratio of 0.6 is greater than 2.7. The functionality of semiconductor image sensor 300A is similar to the semiconductor image sensor 100. However, the reflection occurs at the interface between the low N silicon nitride layer 354 and the high N silicon nitride layer 356. The reflection at the interface between the two silicon nitride layers increases the QE of the semiconductor image sensor 300A in comparison with a device that does not include the silicon nitride layers or the void 150 (FIG. 1). The semiconductor image sensor 300A includes a single pair of alternating silicon nitride layers. In some embodiments, the semiconductor image sensor 300A includes multiple pairs of alternating silicon nitride layers in order to increase the number of interfaces for reflection of light back to the pixel 110. As the number of layers increases, the QE of the pixel 110 increases. However, as the number of layers increases a size of the semiconductor image sensor 300A also increases. In some embodiments, each of the low N silicon nitride layer 354 and the high N silicon nitride layer 356 independently having a thickness ranging from about 15 nm to about 50 nm. If the thickness is too small, then reflection at the interface will be reduced which reduces the QE in some instances. If the thickness is too great, then a size of the semiconductor image sensor 300A is increased without a significant increase in performance in some instances.

In some embodiments, the semiconductor image sensor 300A is usable in a 3DIC, similar to the semiconductor image sensor 100 (FIG. 1). In some embodiments, the semiconductor image sensor 300A is usable in a 2DIC, similar to the semiconductor image sensor 200 (FIG. 2).

Figure 3B:
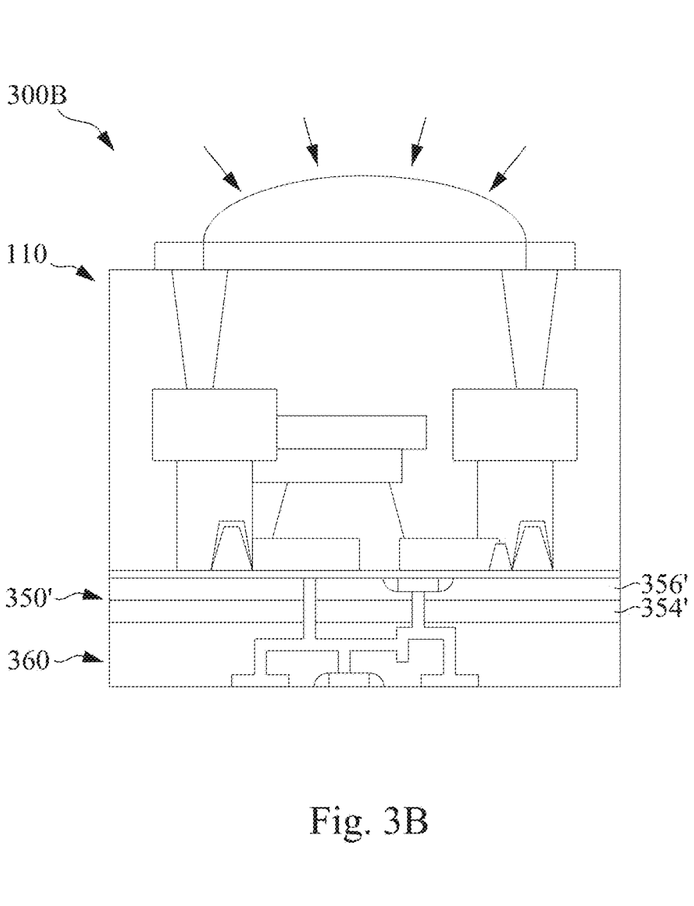
FIG. 3B is a cross-sectional view of a semiconductor image sensor in accordance with some embodiments.

FIG. 3B is a cross-sectional view of a semiconductor image sensor 300B in accordance with some embodiments. In comparison with the semiconductor image sensor 300A, the semiconductor image sensor 300B includes alternating layers 350' in a different order from alternating layers 350. In the alternating layers 350', the high N silicon nitride layer 356' is closer to the pixel 110; and the low N silicon nitride layer 354' is closer to the interconnect 360. The semiconductor image sensor 300B includes a single pair of alternating silicon nitride layers. In some embodiments, the semiconductor image sensor 300B includes multiple pairs of alternating silicon nitride layers in order to increase the number of interfaces for reflection of light back to the pixel 110. As the number of layers increases, the QE of the pixel 110 increases. However, as the number of layers increases a size of the semiconductor image sensor 300B also increases.

In some embodiments, the semiconductor image sensor 300B is usable in a 3DIC, similar to the semiconductor image sensor 100 (FIG. 1). In some embodiments, the semiconductor image sensor 300B is usable in a 2DIC, similar to the semiconductor image sensor 200 (FIG. 2).

Figure 4:
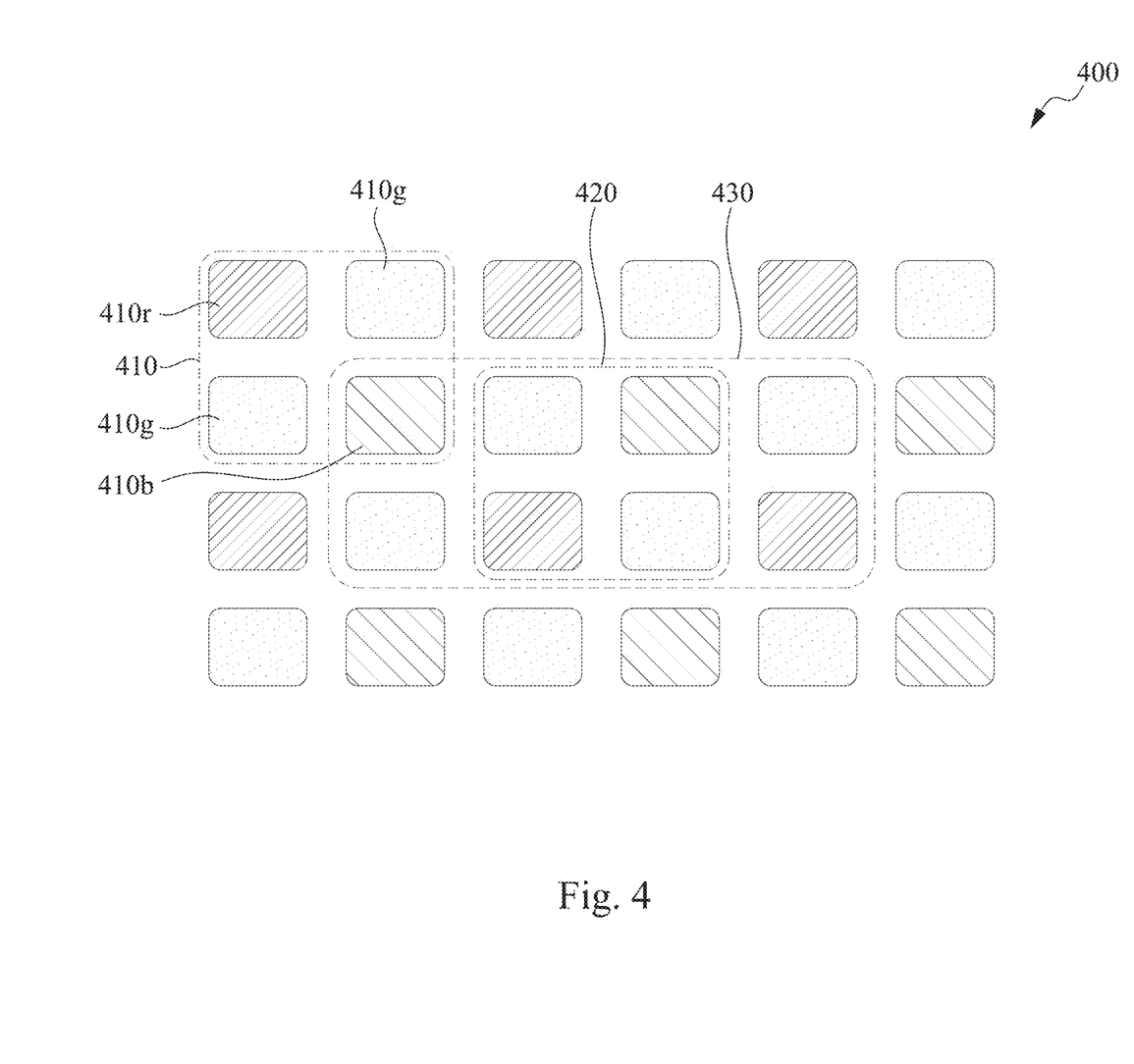
FIG. 4 is a top view of a pixel array for a semiconductor image sensor in accordance with some embodiments.

FIG. 4 is a top view of a pixel array 400 for a semiconductor image sensor in accordance with some embodiments. The pixel array 400 is usable with any of the semiconductor image sensor 100 (FIG. 1), the semiconductor image sensor 200 (FIG. 2), the semiconductor image sensor 300A (FIG. 3A), the semiconductor image sensor 300B (FIG. 3B) or another suitable semiconductor image sensor. Pixels of the pixel array 400 are in a two-dimensional array. The pixels are grouped into pixel groups 410. Each of the pixel groups 410 includes a red pixel 410r, a blue pixel 410b and two green pixels 410g. In some embodiments, the pixel group 410 also includes a white pixel (not shown). The red pixel 410r includes a red filter, e.g., filter 116 (FIG. 1), and is configured to capture red visible light. The blue pixel 410b includes a blue filter, e.g., filter 116 (FIG. 1), and is configured to capture blue visible light. The green pixels 410g include green filters, e.g., filter 116 (FIG. 1), and are configured to capture green visible light. The pixel groups 410 include more green pixels than red or blue pixels because the human eye is more attuned to see to green light than red light or blue light.

In some embodiments, each of the pixels in the pixel array 400 has a structure similar to pixel 110 and include the void 150 (FIG. 1 or FIG. 2). In some embodiments, each of the pixels in the pixel array 400 has a structure similar to pixel 110 and include alternating layers 350 (FIG. 3A) or alternating layers 350' (FIG. 3B). In some embodiments, only green pixels in the pixel array 400 has a structure similar to pixel 110 and include the void 150 (FIG. 1 or FIG. 2). In some embodiments, only green pixels in the pixel array 400 has a structure similar to pixel 100 and include alternating layers 350 (FIG. 3A) or alternating layers 350' (FIG. 3B).

In some embodiments, only green pixels in central region 420 or central region 430 in the pixel array 400 has a structure similar to pixel 110 and include the void 150 (FIG. 1 or FIG. 2); and all pixels (including red and blue pixels) outside of the central region 420 or 430 have a structure similar to pixel 110 and include the void 150 (FIG. 1 or FIG. 2). In some embodiments, only green pixels in central region 420 or central region 430 in the pixel array 400 has a structure similar to pixel 110 and include the void 150 (FIG. 1 or FIG. 2); and all pixels (including red and blue pixels) outside of the central region 420 or 430 have a structure similar to pixel 110 and include alternating layers 350 (FIG. 3A) or alternating layers 350' (FIG. 3B).

The central region 420 includes complete pixel groups 410 with the same design rules applied to the entire pixel group. A design rule includes, for example, only green pixels include the void 150 (FIG. 1 or FIG. 2), the alternating layers 350 (FIG. 3A) or the alternating layers 350' (FIG. 3B); or all pixels include the void 150 (FIG. 1 or FIG. 2), the alternating layers 350 (FIG. 3A) or the alternating layers 350' (FIG. 3B). While a single pixel group 410 is shown as the central region 420, one of ordinary skill in the art would recognize that multiple complete pixel groups 410 are included in the central region 420 in some embodiments.

The central region 430 includes at least one partial pixel group 410. For example, labeled pixel 410b is within the central region 430, but other pixels within the labeled pixel group 410 are not within the central region 430. Therefore, in some embodiments, each of labeled pixels 410r and 410g will include the void 150 (FIG. 1 or FIG. 2), the alternating layers 350 (FIG. 3A) or the alternating layers 350' (FIG. 3B); however, the labeled pixel 410b will not include the void 150 (FIG. 1 or FIG. 2), the alternating layers 350 (FIG. 3A) or the alternating layers 350' (FIG. 3B).

Including the void 150 (FIG. 1 or FIG. 2), the alternating layers 350 (FIG. 3A) or the alternating layers 350' (FIG. 3B) increases manufacturing complexity. Minimizing the number of pixels that have the increased manufacturing complexity increases production efficiency. However, as noted above, the void 150 (FIG. 1 or FIG. 2), the alternating layers 350 (FIG. 3A) or the alternating layers 350' (FIG. 3B) increases QE for the pixel. Since the human eye is more attuned to green light, increases the QE of the green pixels helps to provide a higher quality image as seen using the human eye. In addition, manufacturing variation increases closer to an edge of a device. As a result, the risks of manufacturing a low QE pixel, of any color, near an edge of the device increases. Therefore, having the void 150 (FIG. 1 or FIG. 2), the alternating layers 350 (FIG. 3A) or the alternating layers 350' (FIG. 3B) for all pixels near the edge of the pixel array 400 will also improve the image quality of the semiconductor image sensor.

Figure 5:
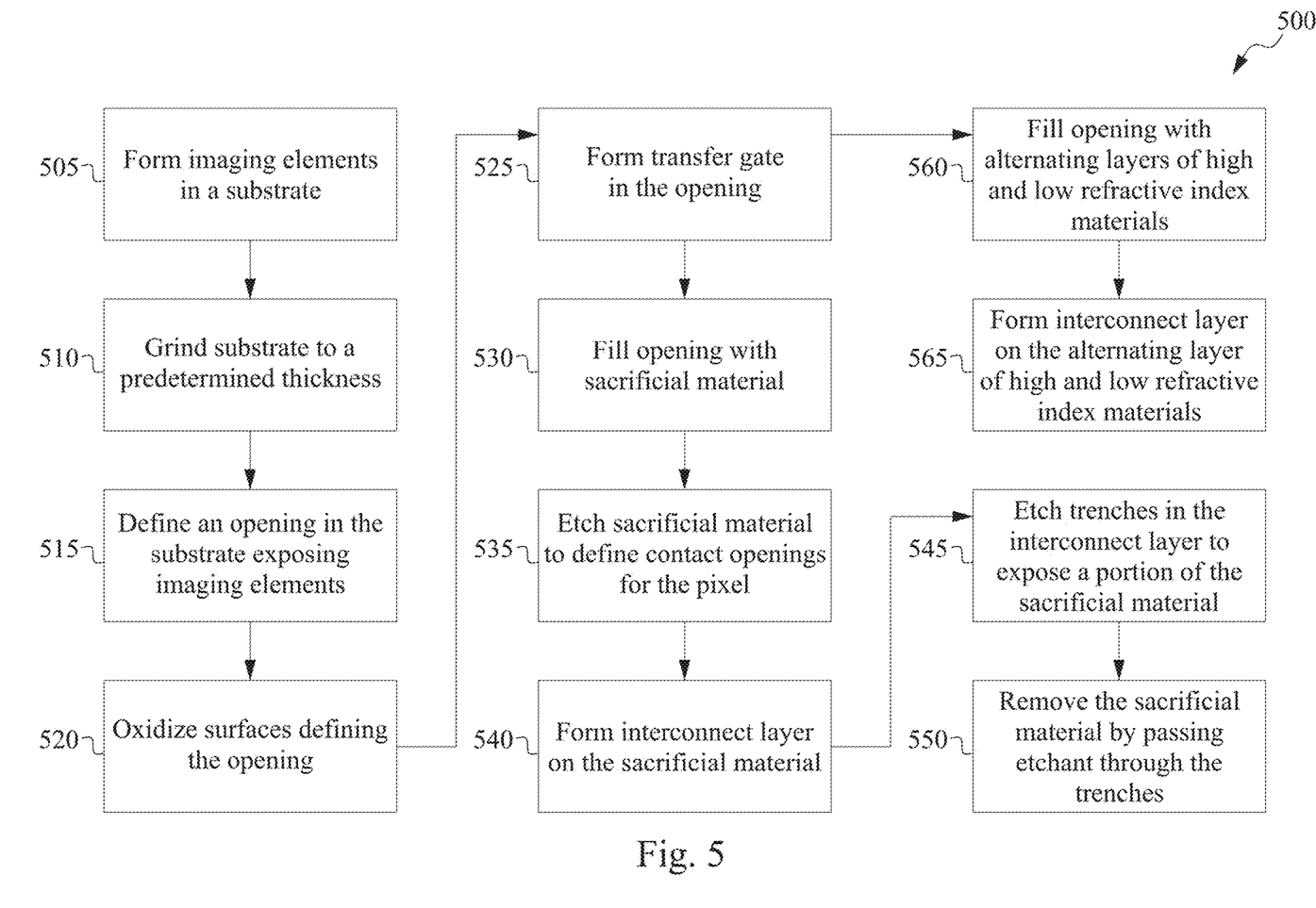
FIG. 5 is a flow chart of a method of making a semiconductor image sensor in accordance with some embodiments.

FIG. 5 is a flow chart of a method 500 of making a semiconductor image sensor in accordance with some embodiments. The method 500 includes an operation 505 for forming imaging elements in a substrate. In some embodiments, the imaging elements are formed using a series of implantation processes. In some embodiments, the imaging elements are formed by attaching filters and/or lens to a surface of the substrate. In some embodiments, forming the imaging elements includes formation of the structure of the pixel 110 (FIG. 1) in the substrate.

The method 500 further includes an operation 510 in which a surface of the substrate is subjected to a grinding process. The grinding process reduces a thickness of the substrate to a predetermined thickness. The grinding process does not expose the imaging elements formed in the substrate. In some embodiments, the predetermined thickness is determined based on a distance between a surface of the substrate and the imaging elements. In some embodiments, the distance ranges from about 25 nm to about 50 nm. If the distance is too small, then reflection will be decreased and QE of the semiconductor image sensor is be reduced in some instances. If the distance is too large, then a size of the semiconductor image sensor is increased without significant improvement in performance in some instances.

The method 500 further includes an operation 515 in which an opening is defined in the substrate to expose the imaging elements. In some embodiments, the opening is defined using an etching process to remove a portion of the substrate. In some embodiments, the etching process includes a wet etching process or a dry etching process. In some embodiments, separate openings are formed for each pixel designed to include the void or alternating layers, as described above. In some embodiments, the opening is formed to be continuous across multiple pixels of the semiconductor image sensor.

The method 500 further includes an operation 520 in which an oxide layer is formed along surface of the opening. In some embodiments, the oxide layer is formed by CVD or another suitable deposition process. In some embodiments, the oxide layer is formed by heating the substrate in an oxygen containing environment.

The method 500 further includes an operation 525 in which a transfer gate is formed in the opening. Forming the transfer gate includes a series of deposition and etching processes in order to define a gate structure. In some embodiments, the transfer gate is formed overlapping different imaging elements formed in the operation 505. In some embodiments, the transfer gate includes a MOS gate. In some embodiments, the transfer gate includes a FinFET gate. In some embodiments, the transfer gate includes a GAA gate.

Figure 6A:
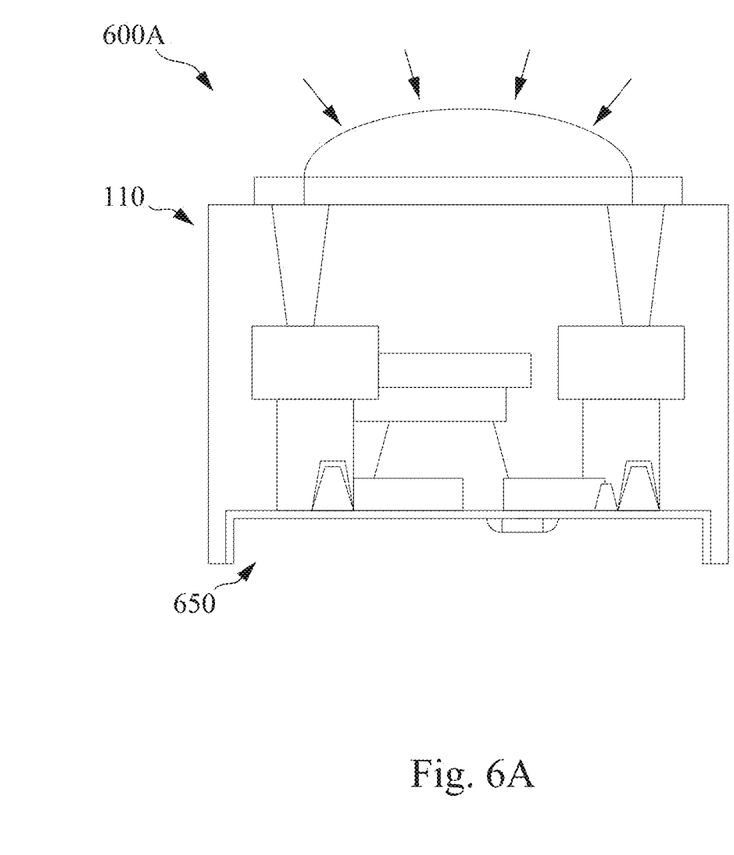
FIGS. 6A-6F are cross-sectional views of a semiconductor image sensor at various stages of fabrication in accordance with some embodiments.

FIG. 6A is a cross-sectional view of a semiconductor image sensor 600A following operation 525 in accordance with some embodiments. The pixel 110 is similar to the pixel in the semiconductor image sensor 100 (FIG. 1) and the description of the pixel 110 is omitted for the sake of brevity. An opening 650 is present in a bottom surface of the substrate. The opening 650 is discontinuous with respect to openings for other pixels. In some embodiments, the opening 650 is continuous across multiple pixels of the semiconductor image sensor 600A.

Returning to the method 500, in some embodiments, the method 500 proceeds to operation 530. In some embodiments, the method 500 proceeds to operation 560. In some embodiments, the method 500 proceeding to the operation 530 produces the semiconductor image sensor 100 (FIG. 1) or the semiconductor image sensor 200 (FIG. 2). In some embodiments, the method 500 proceeding to the operation 560 produces the semiconductor image sensor 300A (FIG. 3A) or the semiconductor image sensor 300B (FIG. 3B).

In operation 530, the opening is filled with a sacrificial material. The sacrificial material has a high etch selectivity with respect to the silicon oxide formed in the operation 520. In some embodiments, the sacrificial material includes silicon nitride, silicon oxynitride or another suitable sacrificial material. In some embodiments, the sacrificial material is deposited using CVD or another suitable deposition process.

Figure 6B:
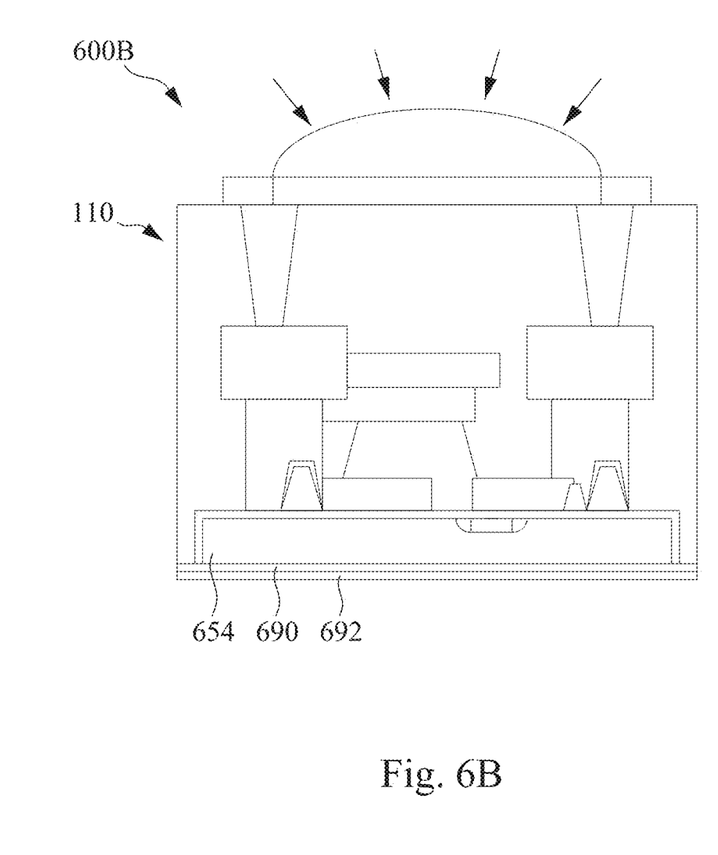

FIG. 6B is a cross-sectional view of a semiconductor image sensor 600B following operation 530 in accordance with some embodiments. In comparison with the semiconductor image sensor 600A, the semiconductor image sensor 600B includes a sacrificial material 654 filling the opening. A hard mask 690 and a photoresist layer 692 are on a surface of the substrate and the sacrificial material 654 for further processing.

Returning to the method 500, the method 500 includes operation 535 in which the sacrificial material is etched in order to define contact openings for the pixel. In some embodiments, the contact openings are defined using photolithography and etching. The contact openings expose portions of the pixel to be electrically connected to other components of the semiconductor image sensor.

Figure 6C:
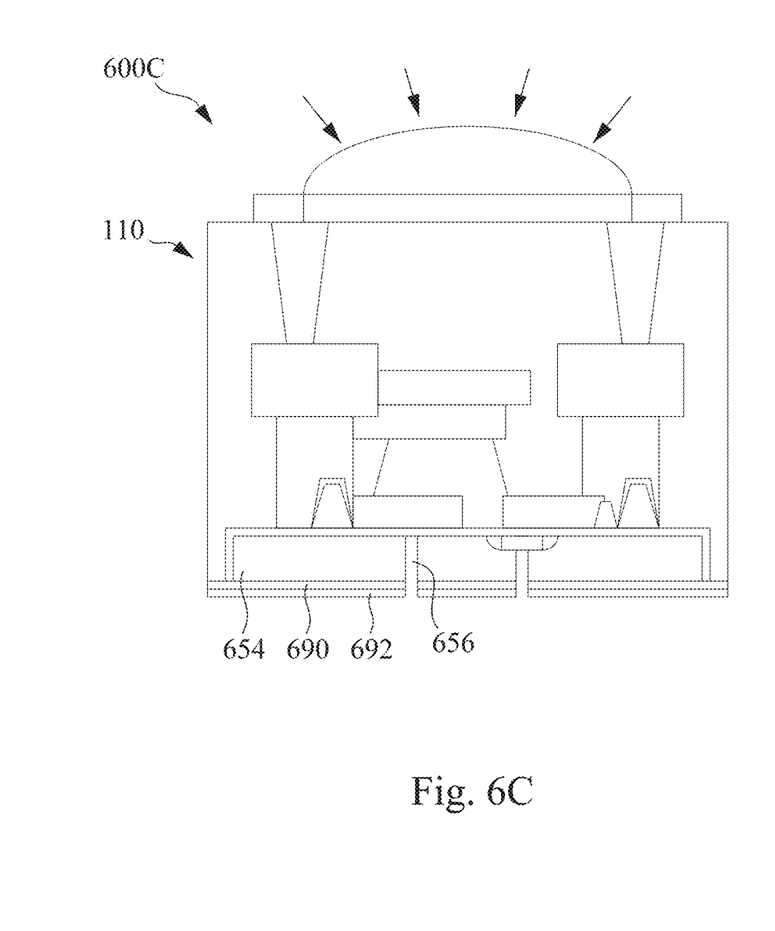

FIG. 6C is a cross-sectional view of a semiconductor image sensor 600C following operation 535 in accordance with some embodiments. In comparison with the semiconductor image sensor 600B, the semiconductor image sensor 600C includes contact openings 656 extending through the sacrificial material 654, the hard mask 690 and the photoresist layer 692.

Returning to the method 500, the method 500 includes operation 540 in which an interconnect layer is formed on the sacrificial material. Forming the interconnect layer includes forming conductive elements in the contact openings in the sacrificial material. In some embodiments, a liner layer is formed in the contact openings prior to forming the conductive element in the contact openings. In some embodiments, multiple interconnect layers are formed in operation 540. In some embodiments, an entirety of the interconnect is formed in the operation 540. Forming the interconnect layer includes a series of deposition processes for forming a layer of dielectric material; etching the layer of dielectric material to define openings and filling the openings with conductive material.

Figure 6D:
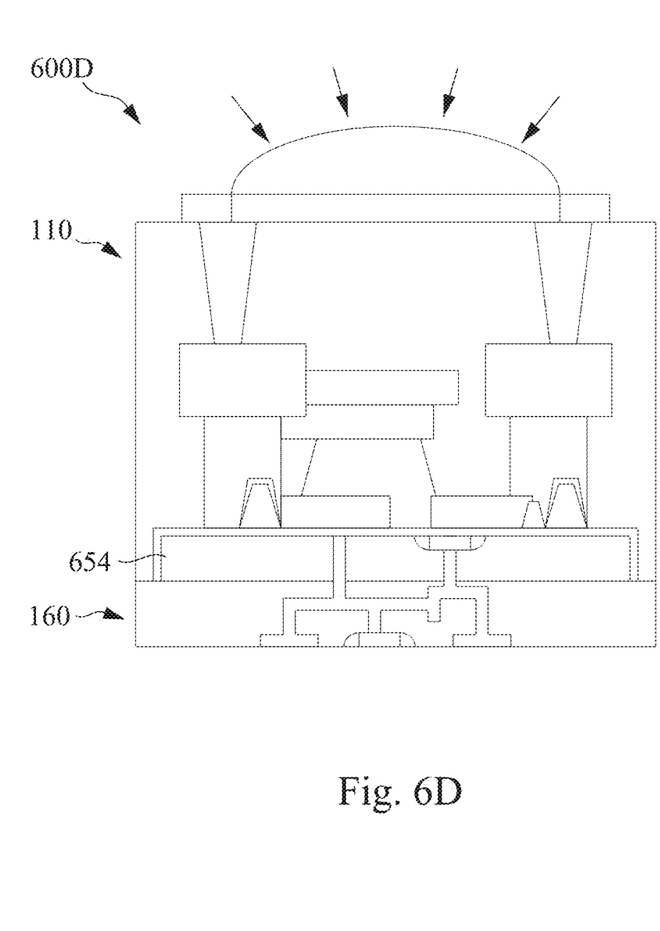

FIG. 6D is a cross-sectional view of a semiconductor image sensor 600D following operation 540 in accordance with some embodiments. In comparison with the semiconductor image sensor 600C, the semiconductor image sensor 600D includes the interconnect 160. Prior to formation of the interconnect 160, the hard mask 690 and the photoresist layer 692 were removed. Conductive elements extend through the sacrificial material 654 to electrically connect to the pixel 110.

Returning to the method 500, the method 500 includes operation 545 in which trenches are etched in the interconnect layer to expose a portion of the sacrificial material. In some embodiments, the trenches are etched using a wet etching process or a dry etching process. In some embodiments, two trenches are etched in the interconnect layer. In some embodiments, more than two trenches are etched in the interconnect layer. In some embodiments, the operation 545 is performed prior to completing formation of the entire interconnect. In some embodiments, the operation 545 is performed after completing formation of the entire interconnect. In some embodiments, the trenches are lined with a liner layer to protect the interconnect structure during later processing.

Figure 6E:
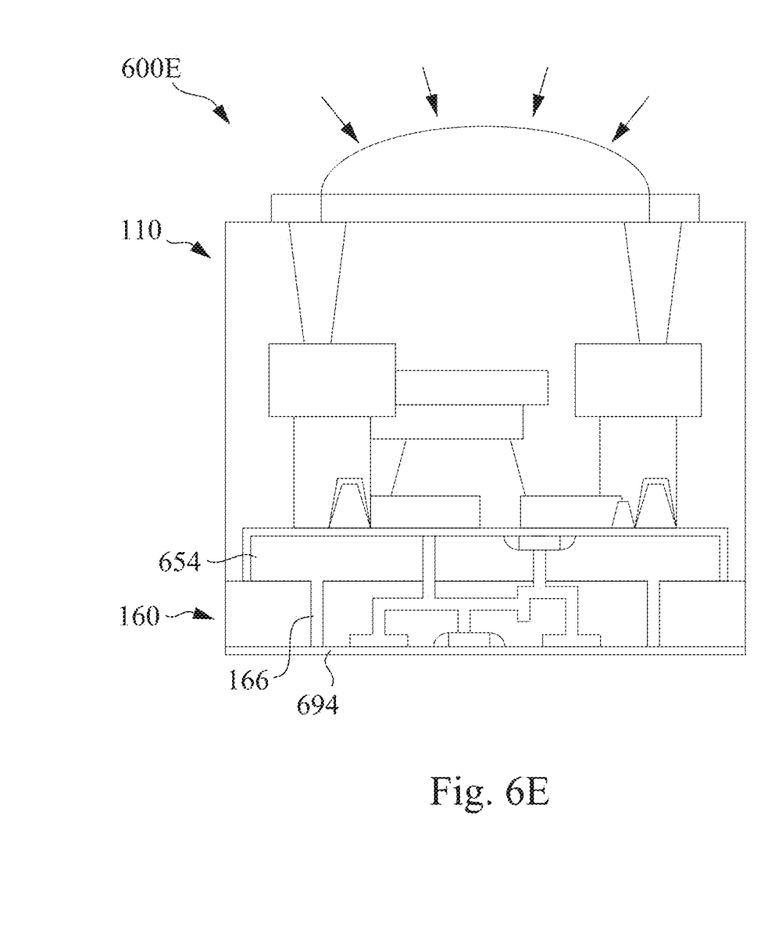

FIG. 6E is a cross-sectional view of a semiconductor image sensor 600E following operation 545 in accordance with some embodiments. In comparison with the semiconductor image sensor 600D, the semiconductor image sensor 600E includes the trenches 166 through the interconnect 160. A photoresist layer 694 is on a surface of the interconnect 160 to help define the location of the trenches 166.

Returning to the method 500, the method 500 includes operation 550 in which the sacrificial material is removed by passing etchants through the trenches. In some embodiments, etchant is passed through each of the trenches. In some embodiments, the etching is passed introduced through less than all of the trenches and at least one of the trenches is used to permit etchant and sacrificial material to be removed from the semiconductor image sensor.

Figure 6F:
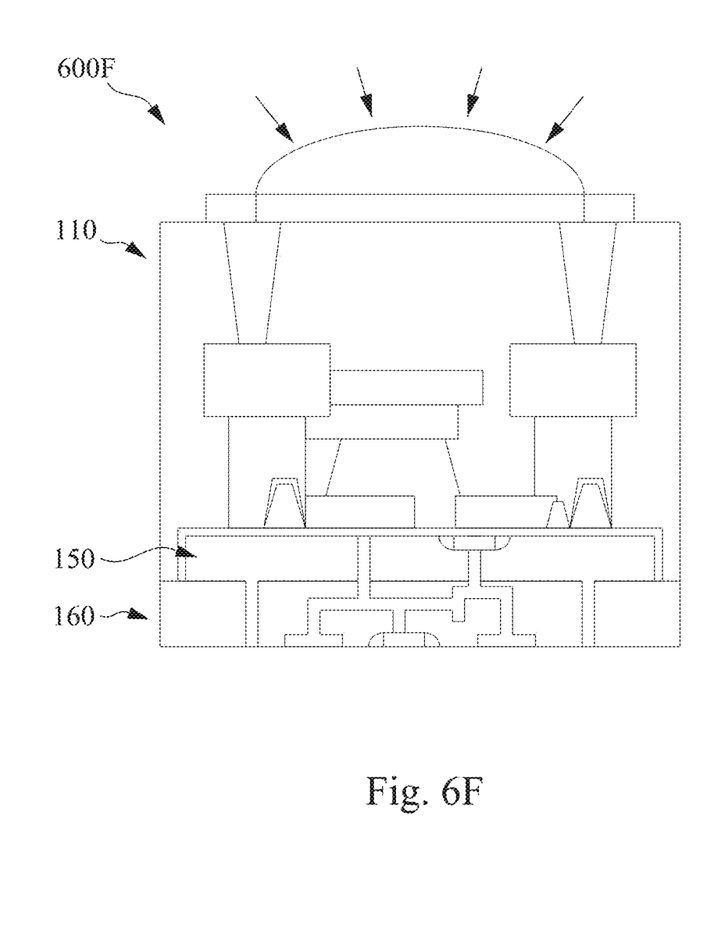

FIG. 6F is a cross-sectional view of a semiconductor image sensor 600F following operation 550 in accordance with some embodiments. In comparison with the semiconductor image sensor 600E, the semiconductor image sensor 600F is free of the sacrificial material. The photoresist layer 694 has also been removed.

Returning to the method 500, where the method 500 proceeds from the operation 525 to the operation 560 alternating layers of high and low refractive index materials are formed in the opening. In some embodiments, the alternating layers of high and low refractive index material include layers of silicon nitride having different N/Si ratio compositions. In some embodiments, the alternating layers of high and low refractive index material are formed by tuning a flow rate of nitrogen precursor into a deposition chamber. In some embodiments, forming the alternating layers of high and low refractive index material includes forming a single pair of alternating layers. In some embodiments, forming the alternating layers of high and low refractive index material includes forming multiple pairs of alternating layers.

In operation 565 an interconnect structure is formed on the alternating layers of high and low refractive index material. Forming the interconnect structure includes forming contacts extending through the alternating layers of high and low refractive index material to electrically connect the interconnect to the pixel. Forming the interconnect layer includes a series of deposition processes for forming a layer of dielectric material; etching the layer of dielectric material to define openings and filling the openings with conductive material.

In some embodiments, the method 500 includes additional operations. For example, in some embodiments, a second component is bonded to a surface of the interconnect opposite to the imaging elements to form a 3DIC, similar to the semiconductor image sensor 100 (FIG. 1). In some embodiments, at least one operation from the method 500 is omitted. For example, in some embodiments, operation 510 is omitted and the imaging elements are formed at a predetermined depth within the substrate. In some embodiments, operations within the method 500 are combined. For example, in some embodiments, operations 535 and 540 are combined. In some embodiments, operations of method 500 are performed in a different order. For example, in some embodiments, a portion of operation 540 is performed after operation 550; and as a result a portion of the trenches in the interconnect is filled.

An aspect of this description relates to a semiconductor image sensor. The semiconductor image sensor includes a pixel. The pixel includes a first substrate; and a photodiode in the first substrate. The semiconductor image sensor further includes an interconnect structure electrically connected to the pixel. The semiconductor image sensor further includes a reflection structure between the interconnect and the photodiode, wherein the reflection structure is configured to reflect light passing through the photodiode back toward the photodiode. In some embodiments, the reflection structure includes an air gap. In some embodiments, the reflection structure includes alternating layers of high and low refractive index. In some embodiments, the alternating layers of high and low refractive index include a first silicon nitride layer having a first N/Si ratio, and a second silicon nitride layer having a second N/Si ratio, wherein the first N/Si ratio is different from the second N/Si ratio. In some embodiments, the first silicon nitride layer is between the second silicon nitride layer and the interconnect structure. In some embodiments, the semiconductor image sensor further includes a transistor electrically connected to the photodiode by the interconnect structure. In some embodiments, the transistor is on an opposite side of the interconnect structure from the photodiode. In some embodiments, the transistor is on a same side of the interconnect structure as the photodiode. In some embodiments, the interconnect structure defines a plurality of trenches in fluid contact with the reflection structure. In some embodiments, the interconnect structure includes a conductive element extending through the reflection structure to electrically connect to the photodiode. In some embodiments, the pixel further includes a transfer gate for selectively electrically connecting the photodiode to a highly doped region in the first substrate. In some embodiments, the transfer gate is in the reflection structure.

An aspect of this description relates to a semiconductor image sensor. The semiconductor image sensor includes a pixel array. The pixel array includes a first pixel configured to detect green light; and a second pixel configured to detected light other than green light. The semiconductor image sensor further includes an interconnect structure electrically connected to each of the first pixel and the second pixel. The semiconductor image sensor further includes a first reflection structure between the interconnect structure and the first pixel, wherein the reflection structure is configured to reflect light pass through the first pixel back toward the first pixel, and a space between the interconnect structure and the second pixel is free of the reflection structure. In some embodiments, the semiconductor image sensor further includes a second reflection structure, wherein the pixel array further includes a third pixel configured to detect light other than green light, the second reflection structure is configured to reflect light pass through the third pixel back toward the third pixel. In some embodiments, the third pixel is closer to an edge of the pixel array than the second pixel. In some embodiments, the third pixel is configured to detect a same color light as the second pixel. In some embodiments, the semiconductor image sensor further includes a transistor electrically connected to the first pixel by the interconnect structure. In some embodiments, the transistor is on an opposite side of the interconnect structure from the first pixel. In some embodiments, the transistor is on a same side of the interconnect structure as the first pixel.

An aspect of this description relates to a method of making a semiconductor image sensor. The method includes forming a photodiode in a substrate. The method further includes forming a recess in the substrate. The method further includes depositing a sacrificial material in the recess. The method further includes forming an interconnect structure over the sacrificial material. The method further includes etching a plurality of trenches in the interconnect structure. The method further includes removing the sacrificial material by passing an etchant through the plurality of trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image sensor comprising:
a pixel, wherein the pixel comprises:
a first substrate; and
a photodiode in the first substrate;
an interconnect structure electrically connected to the pixel; and
a reflection structure between the interconnect structure and the photodiode, wherein the reflection structure is configured to reflect light passing through the photodiode back toward the photodiode, and the interconnect structure comprises a conductive element extending through the reflection structure to electrically connect to the photodiode.

2. The semiconductor image sensor of claim 1, wherein the reflection structure comprises an air gap.

3. The semiconductor image sensor of claim 1, wherein the reflection structure comprises alternating layers of high and low refractive index.

4. The semiconductor image sensor of claim 3, wherein the alternating layers of high and low refractive index comprise:
a first silicon nitride layer having a first N/Si ratio, and
a second silicon nitride layer having a second N/Si ratio, wherein the first N/Si ratio is different form the second N/Si ratio.

5. The semiconductor image sensor of claim 4, wherein the first silicon nitride layer is between the second silicon nitride layer and the interconnect structure.

6. The semiconductor image sensor of claim 1, further comprising a transistor electrically connected to the photodiode by the interconnect structure.

7. The semiconductor image sensor of claim 6, wherein the transistor is on an opposite side of the interconnect structure from the photodiode.

8. The semiconductor image sensor of claim 6, wherein the transistor is on a same side of the interconnect structure as the photodiode.

9. The semiconductor image sensor of claim 1, wherein the interconnect structure defines a plurality of trenches in fluid contact with the reflection structure.

10. The semiconductor image sensor of claim 1, wherein the conductive element extends through an entirety of the reflection structure.

11. The semiconductor image sensor of claim 1, wherein the pixel further comprises a transfer gate for selectively electrically connecting the photodiode to a highly doped region in the first substrate.

12. The semiconductor image sensor of claim 11, wherein the transfer gate is in the reflection structure.

13. A semiconductor image sensor comprising:
a pixel array, wherein the pixel array comprises:
a first pixel configured to detect green light; and
a second pixel configured to detect light other than green light;
an interconnect structure electrically connected to each of the first pixel and the second pixel; and
a first reflection structure between the interconnect structure and the first pixel, wherein the first reflection structure is configured to reflect light pass through the first pixel back toward the first pixel, a space between the interconnect structure and the second pixel is free of the first reflection structure, and the interconnect structure comprises a conductive element extending through the reflection structure to electrically connect to the photodiode.

14. The semiconductor image sensor of claim 13, further comprising a second reflection structure, wherein the pixel array further comprises a third pixel configured to detect light other than green light, the second reflection structure is configured to reflect light pass through the third pixel back toward the third pixel.

15. The semiconductor image sensor of claim 14, wherein the third pixel is closer to an edge of the pixel array than the second pixel.

16. The semiconductor image sensor of claim 14, wherein the third pixel is configured to detect a same color light as the second pixel.

17. The semiconductor image sensor of claim 13, further comprising a transistor electrically connected to the first pixel by the interconnect structure.

18. The semiconductor image sensor of claim 17, wherein the transistor is on an opposite side of the interconnect structure from the first pixel.

19. The semiconductor image sensor of claim 17, wherein the transistor is on a same side of the interconnect structure as the first pixel.

\* \* \* \* \*